(12) United States Patent
Chapman et al.

(10) Patent No.: US 6,708,191 B2
(45) Date of Patent: Mar. 16, 2004

(54) CONFIGURABLE LOGIC BLOCK WITH AND GATE FOR EFFICIENT MULTIPLICATION IN FPGAS (75) Inventors: Kenneth D. Chapman, Woking (GB); Steven P. Young, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/192,354

(22) Filed: Jul. 9, 2002

(65) Prior Publication Data

US 2002/0178431 A1 Nov. 28, 2002

Related U.S. Application Data

(62) Division of application No. 08/768,818, filed on Jan. 21, 1997, now Pat. No. 6,427,156.

(51) Int. Cl.[7] .................................................. G06F 7/38
(52) U.S. Cl. ......................................... 708/235; 326/39
(58) Field of Search ................................. 708/230, 232, 708/234, 235, 236; 326/37, 38, 39, 40, 41, 44, 47

(56) References Cited

U.S. PATENT DOCUMENTS

| 4,758,745 A | 7/1988 | Elgamal et al. |
| RE34,363 E | 8/1993 | Freeman, deceased |
| 5,243,238 A | 9/1993 | Kean |
| 5,245,227 A | 9/1993 | Furtek et al. |
| 5,267,187 A | 11/1993 | Hsieh et al. |
| 5,349,250 A | 9/1994 | New |
| 5,481,206 A | 1/1996 | New et al. |
| 5,682,107 A | 10/1997 | Tavana et al. |
| 5,724,276 A | 3/1998 | Rose et al. |
| 5,889,413 A | 3/1999 | Bauer |

FOREIGN PATENT DOCUMENTS

| EP | 0 630 115 A2 | 12/1994 |
| GB | 2 295 738 A | 6/1996 |

*Primary Examiner*—Chuong Dinh Ngo
(74) *Attorney, Agent, or Firm*—T. Lester Wallace; Edel M. Young; Lois D. Cartier (57) ABSTRACT

An improved CLB architecture, wherein the use of dedicated AND gates to generate a carry chain input signal facilitates low latency multiplication and makes efficient use of four-input function generators. In one embodiment of the invention, when multiplication using a binary addition tree algorithm is used, AND gates to implement single-bit multiplication are provided within the available function generators and duplicated in a dedicated AND gate accessible outside the corresponding function generator as a carry-chain input signal. In another embodiment, carry chain multiplexers can be selectively configured as AND or OR gates to facilitate certain arithmetic or comparison functions for the outputs of a plurality of function generators.

16 Claims, 14 Drawing Sheets

Configurable Logic Block

Fig. 15 FUNCTION GENERATOR

CONFIGURABLE LOGIC BLOCK WITH AND GATE FOR EFFICIENT MULTIPLICATION IN FPGAS

CROSS-REFERENCE TO RELATED APPLICATIONS

This application relates to the following commonly assigned U.S. Patents, all of which are incorporated herein by reference:

1. U.S. Pat. No. 5,267,187 by inventors Hung-Cheng Hsieh, William S. Carter, Charles R. Erickson, and Edmond Y. Cheung entitled "LOGIC STRUCTURE AND CIRCUIT FOR FAST CARRY";
2. U.S. Pat. No. 5,349,250 by inventor Bernard J. New entitled "LOGIC STRUCTURE AND CIRCUIT FOR FAST CARRY";
3. U.S. Pat. No. 5,682,107 by inventors Danesh Tavana, Wilson K. Yee and Victor A. Holen entitled "FPGA ARCHITECTURE WITH REPEATABLE TILES INCLUDING ROUTING MATRICES AND LOGIC MATRICES"; and
4. U.S. Pat. No. 5,889,413 by inventor Trevor J. Bauer entitled "LOOKUP TABLES WHICH DOUBLE AS SHIFT REGISTERS".

FIELD OF THE INVENTION

This invention relates to programmable logic devices having a repeating pattern of logic blocks, and more particularly to an improved logic block therefor.

BACKGROUND OF THE INVENTION

Field programmable gate arrays (FPGAs) are well known in the art. An FPGA comprises an array of configurable logic blocks (CLBs) which are interconnected to each other through a programmable interconnect structure to provide a logic function desired by a user.

U.S. Pat. No. 4,870,302, reissued as U.S. Pat. No. RE 34,363, and incorporated herein by reference, describes a well known FPGA architecture. Other publications, such as El Gamal's U.S. Pat. No. 4,758,745, Kean's U.S. Pat. No. 5,243,238, and Camarota and Furtek's U.S. Pat. No. 5,245,227, also incorporated herein by reference, describe other FPGA architectures. Pages 4–5 through 4–45 of the Xilinx 1996 Data Book entitled "The Programmable Logic Data Book", available from Xilinx, Inc., 2100 Logic Drive, San Jose, Calif. 95124, also incorporated herein by reference, describe several products which implement a number of FPGA architectures.

An FPGA is a general purpose device, i.e., it is capable of performing any one of a plurality of functions, and is programmed by an end user to perform a selected function. Because of this design flexibility, a general purpose FPGA includes a significant number of wiring lines and transistors, many of which remain unused in any particular application. FPGAs include overhead circuits which facilitate programming of the FPGA to do the specified function. To the extent possible without interfering with required functions, there is a need to conserve overhead chip area by using logic components efficiently. There is a need to minimize both the number of routing lines in a device and the number of logic blocks that must be used to perform a given logic function.

In U.S. Pat. No. 5,682,107 of Tavana, Yee and Holen, a CLB is disclosed wherein four lookup table function generators each have four input lines and an output line connected as the control input to a carry chain multiplexer, at least one carry chain multiplexer being associated with each function generator. Each carry chain multiplexer receives a first input from the carry chain (i.e., the output of the prior multiplexer in the serial array of carry chain multiplexers) and a second input from an additional distinct input line to the CLB. The function and structure of a carry chain are described at length in commonly assigned U.S. Pat. No. 5,349,250 to New.

The following drawing conventions are used throughout the figures. A small solid black dot at the intersections of two lines indicates a permanent electrical connection between the crossing lines. An open circle enclosing an intersection between two lines indicates a programmable connection between the lines (for example, a pass transistor, which is turned on to make the connection). Open circles represent bidirectional signal flow between the two lines. An open triangle at an intersection of two lines indicates a programmable connection with signal flow going onto the line pointed to by the apex of the triangle. (The signal is of course then present on the full length of the line. Thus, a triangle pointing in the opposite direction would have the same signal flow because the triangle points to the same wire.) Programmable connections are provided at programmable interconnection points (PIPs), wherein each PIP includes at least one transistor.

Figure 3:
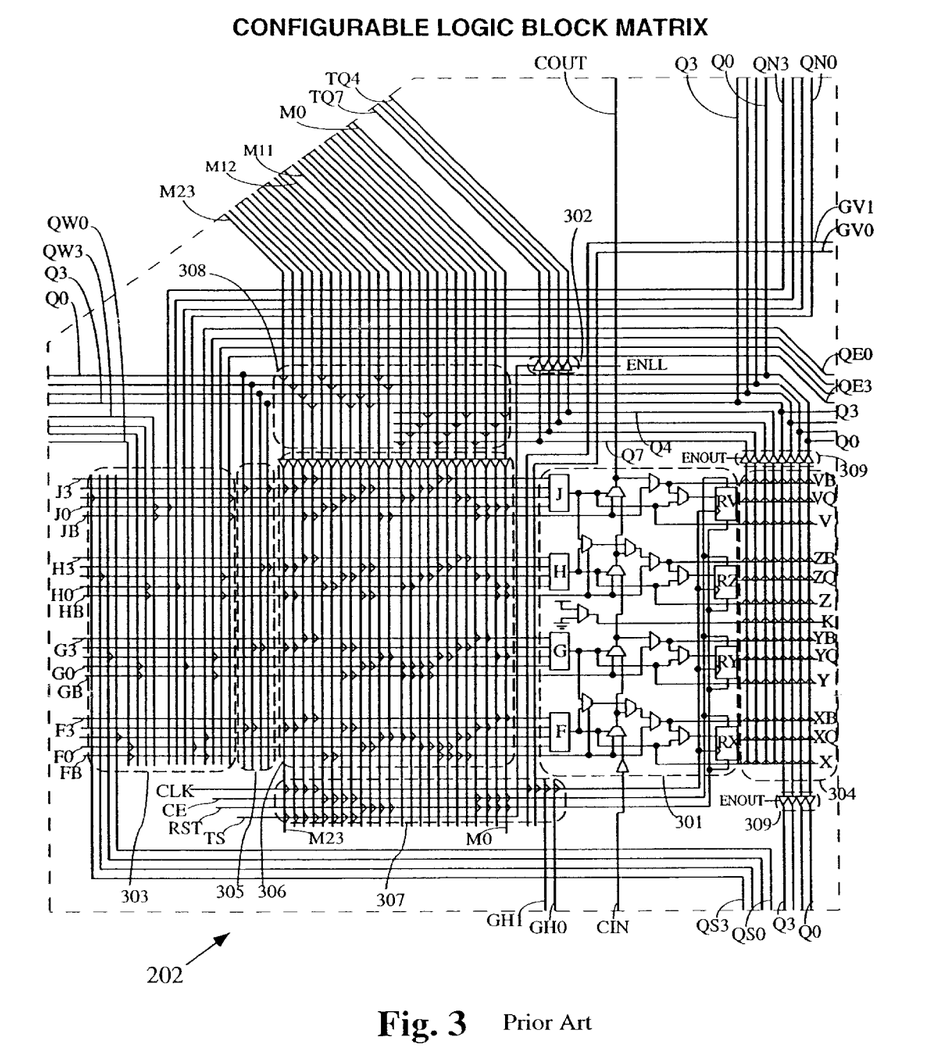
FIG. 3 illustrates a CLB matrix which is part of the tile of FIG. 2.

A triangle that is on a line but not at an intersection indicates a buffer that produces signal flow in the direction indicated by the apex of the triangle. In FIG. 3, except for global lines CLK, CE, RST, TS, ENOUT, and ENLL a line which ends within the tile or matrix structure (i.e., does not extend to the border of the tile or matrix) is physically terminated within the tile. A line which extends to the border of the tile or matrix connects to a line on the next tile, which it contacts when two tiles are abutted together. Note that some lines which extend to an edge of a tile and thus into an adjacent tile change names at the tile boundary.

Figure 1:
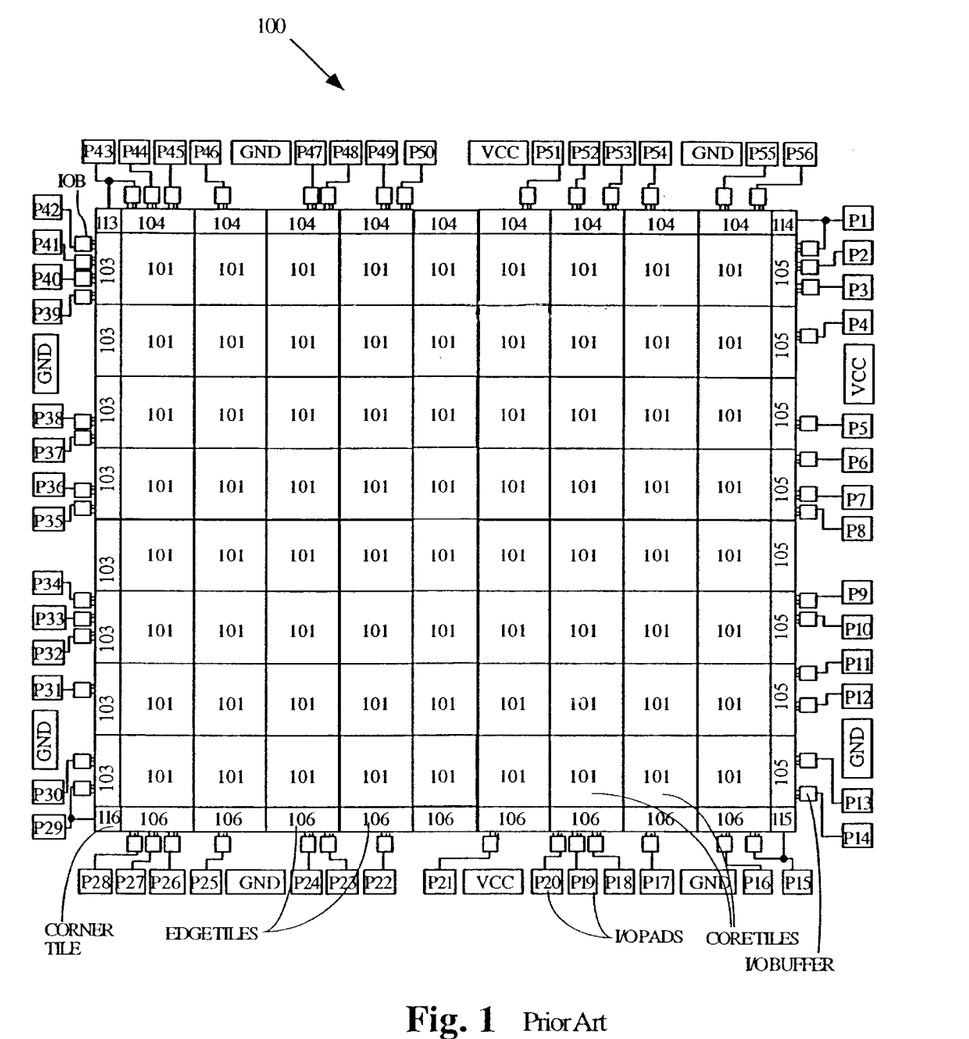
FIG. 1 shows an FPGA chip in which the CLB of the invention may be used.

FIG. 1 shows an FPGA chip 100 in which the CLB of the invention may be employed. In the center portion of chip 100 are a plurality of core tiles 101, which are interconnected by conductive lines (described in detail below). Chip 100 includes pads, i.e., pads P1–P56, and input/output blocks (IOBs) for connecting edge tiles 103, 104, 105, 106, and corner tiles 113–116 to external pins of a package that holds chip 100. Each edge tile and corner tile is further connected to a core tile 101. Power voltage source pads VCC and ground source pads GND have connections (not shown) in a conventional manner throughout chip 100.

Figure 2:
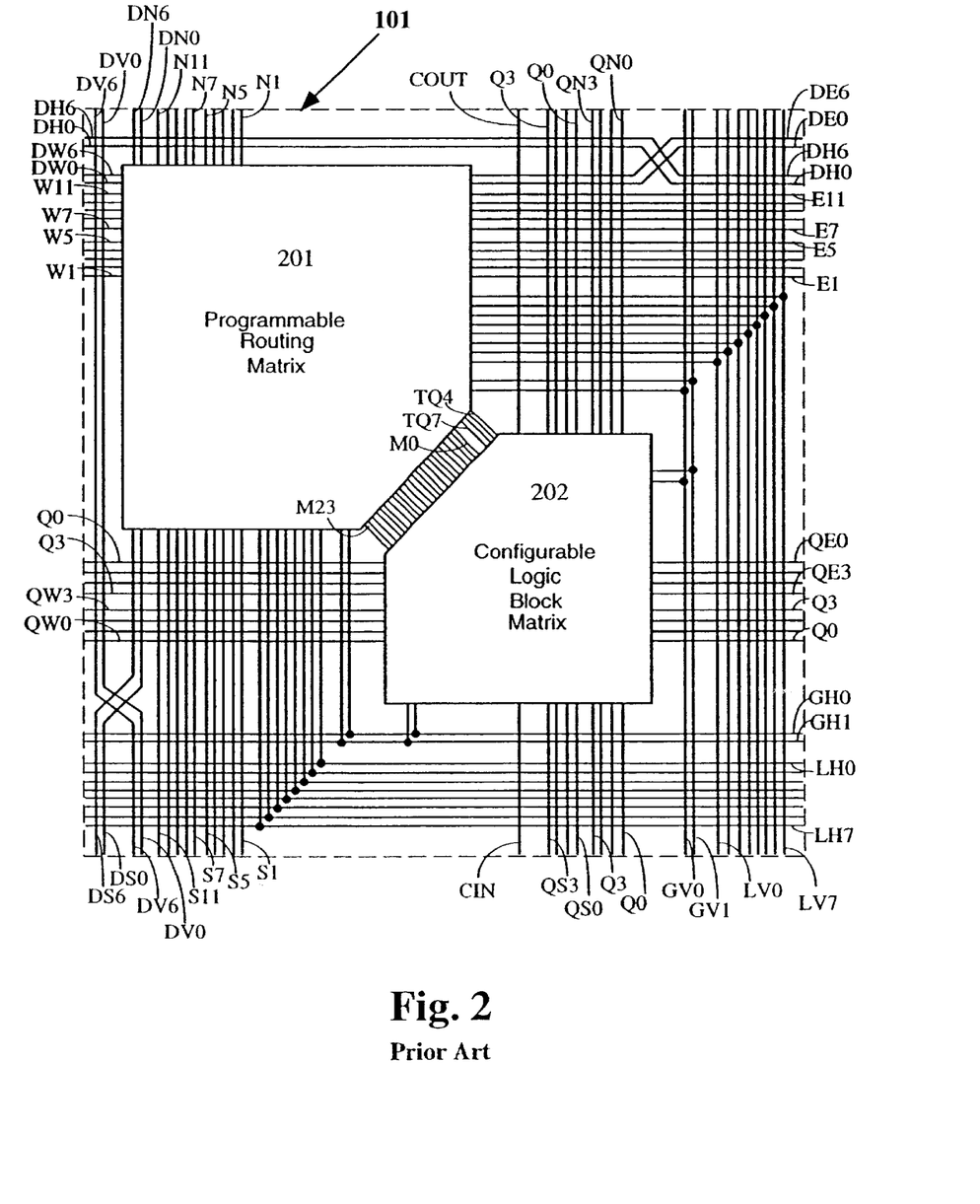
FIG. 2 shows a single core tile which populates a majority of the FPGA chip illustrated in FIG. 1 and which is further described in U.S. Pat. No. 5,682,107 by inventors Danesh Tavana, Wilson K. Yee and Victor A. Holen.

FIG. 2 shows a core tile 101. Core tile 101 includes a programmable routing matrix 201 and a CLB matrix 202. Programmable routing matrix 201 is described in detail by Tavana et al. in U.S. Pat. No. 5,682,107. CLB matrix 202 is described in reference to FIG. 3 and also in detail in the related Tavana et al. patent application.

In FIG. 2, CLB matrix 202 is connected to another CLB matrix in a tile to the west (not shown) by output lines Q0–Q3 and input lines QW0–QW3. CLB matrix 202 connects to a CLB matrix in the tile to the north (not shown) by output lines Q0–Q3 and input lines QN0–QN3, to a CLB matrix in the east by output lines Q0–Q3 and input lines QE0–QE3, and to a CLB matrix in the south tile (not shown) by output lines Q0–Q3 and input lines QS0–QS3. Note that carry-in line CIN and carry-out line COUT, which extend vertically in tile 101, connect to carry-out and carry-in lines, respectively, in adjacent tiles north and south. Certain labels shown but not discussed in FIG. 2 are discussed by Tavana et al. in related U.S. Pat. No. 5,682,107 and are shown here for the convenience of the reader.

The carry-in and carry-out lines form a fast carry path for arithmetic functions, as discussed in detail by Bernard J. New in U.S. Pat. No. 5,349,250, entitled "LOGIC STRUCTURE AND CIRCUIT FOR FAST CARRY", which is incorporated herein by reference. Programmable routing matrix 201 is connected in the four directions shown, and additionally connects to CLB matrix 202. Programmable routing matrix includes a programmable interconnect structure for interconnecting the five sets of incoming lines to each other.

CLB Matrix 202

FIG. 3 illustrates CLB matrix 202 of FIG. 2. CLB matrix 202 includes a CLB 301, a tristate buffer block 302, an input interconnect structure 303, a CLB output interconnect structure 304, a feedback interconnect structure 305, a general input interconnect structure 306, a register control interconnect structure 307, an output interconnect structure 308, and output enable blocks 309. The structure of FIG. 3 is described in detail by Tavana et al. in related patent U.S. Pat. No. 5,682,107.

Configurable Logic Block 301

Figure 4:
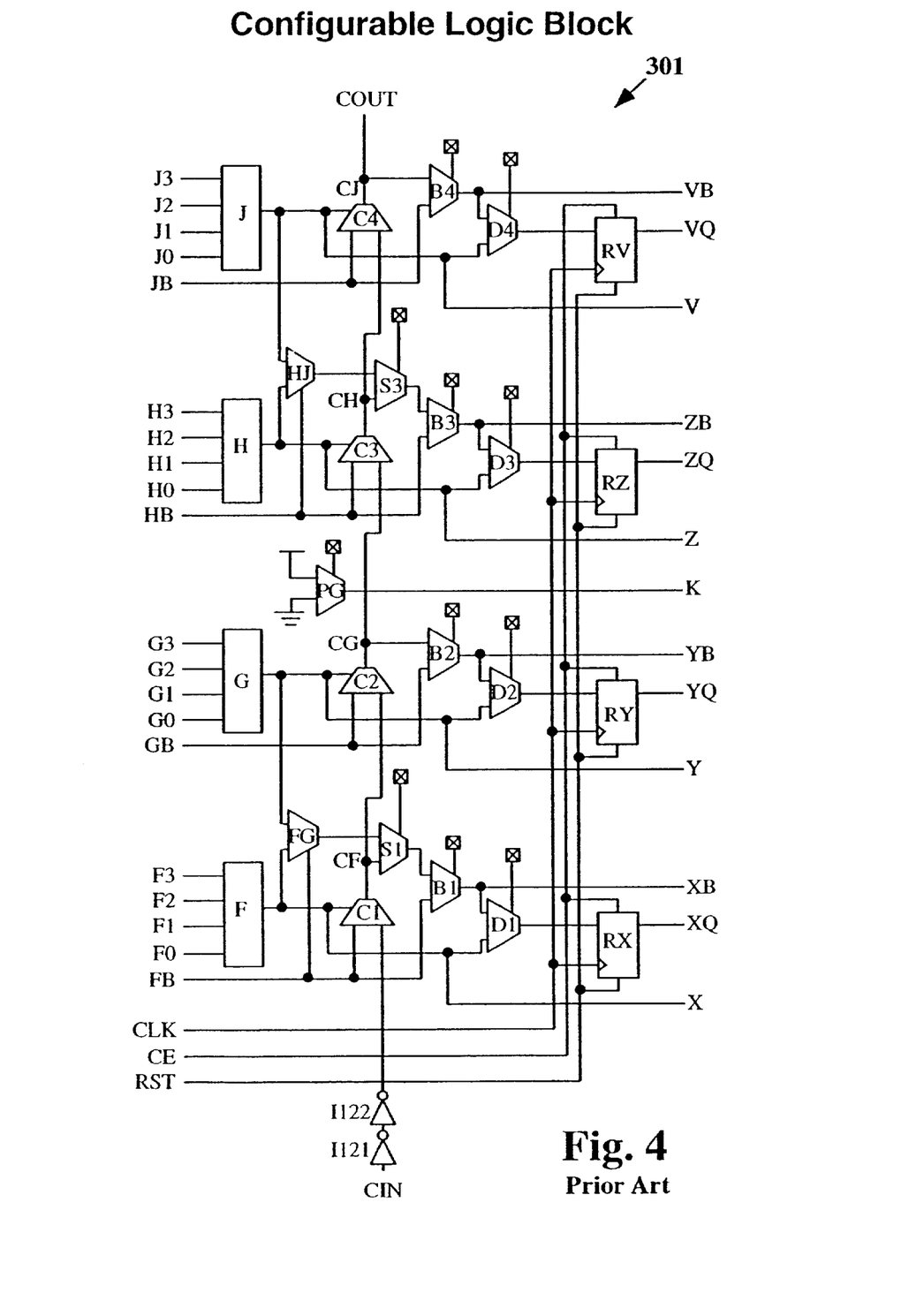
FIG. 4 illustrates the CLB in the matrix of FIG. 3.

A prior art CLB 301 is illustrated in FIG. 4. CLB 301 includes four function generators F, G, H, and J. Each function generator comprises a 16-bit lookup table that generates an output signal determined by the four input signals provided to the function generator and the 16 values stored in the lookup table. Thus, function generator F generates an output signal determined by the input signals provided on lines F0–F3, function generator G generates an output signal determined by the signals provided on CLB input lines G0–G3, and so on for H and J. This CLB is discussed in detail by Tavana et al. in application Ser. No. 08/618,445, incorporated by reference.

Function generators F, G, H, and J provide output signals on CLB output lines X, Y, Z, and V, respectively. The FIG. 4 CLB includes a carry chain for fast implementation of arithmetic functions. The output signals from function generators F, G, H, and J control multiplexers C1, C2, C3, and C4, thereby providing a cumulative carry-out function COUT. Multiplexer C1 receives a carry-in signal on line CIN and an input signal on line FB, and generates an output signal on line CF. Multiplexer C2 receives the signal on line CF and an input signal on line GB, and generates an output signal on line CG. Multiplexers C3 and C4 are connected in the same manner as multiplexers C1 and C2. Multiplexer C4 provides an output signal on line COUT from CLB 301. For a detailed discussion of the implementation of arithmetic functions, see commonly assigned U.S. Pat. No. 5,349,250 invented by Bernard E. New, entitled "LOGIC STRUCTURE AND CIRCUIT FOR FAST CARRY", which is incorporated herein by reference.

In addition to function generators F, G, H, and J, each CLB 301 includes four storage devices RX, RY, RZ, and RV. These storage devices RX, RY, RZ, and RV each comprise flip flops with master and slave stages and an output multiplexer which takes outputs from the master and slave stages as inputs. Thus, storage devices RX, RY, RZ, and RV can be configured by the multiplexer to serve as either flip flops or as latches. The outputs of storage devices RX through RV appear on output signal lines XQ through VQ, respectively.

Typically, periodic repowering of the carry signal is necessary. To provide this repowering, a repowering buffer comprising inverters I121 and I122 is provided.

In FIG. 4, CLB 301 includes five input lines per function generator. For example, referring to function generator F, CLB input lines F0–F3 provide four input signals to function generator F, and a fifth CLB input line FB provides a multiplexer control input signal. Function generators G, H, and J are structured in a similar manner. Three input lines CLK, CE, and RST provide clock, clock enable, and reset signals, respectively, to registers RX, RY, RZ, and RV.

In the embodiment of FIG. 4, multiplexers D1–D4 selectively provide either the output signals from function generators F, G, H, and J (the signals on CLB output lines X through V) or the output signals from multiplexers B1–B4 (the signals on CLB output lines XB through VB) to registers RX through RV, respectively. If multiplexers S1 and S3 are set to forward the carry signals CF and CH of multiplexers C1 and C3, respectively, then multiplexers B1–B4 select between the input signals on CLB input lines FB through JB, respectively, and the output signals of multiplexers C1–C4. Multiplexers FG and HJ allow functions of five input signals to be generated by loading a 32-bit truth table into two 16-bit function generators, duplicating four input signals to the two function generators and applying the fifth input signal to line FB or HB. Multiplexer PG provides a local source of power or ground voltage on line K.

Multiplexers C1–C4, in addition to being used for the carry function in an arithmetic operation, also generate wide AND and OR functions. To generate the AND function, a logic 0 is placed on line FB. This constant logic 0 input causes multiplexer C1 to generate an AND function of the F function generator output signal on CLB output line X and the carry-in signal on line CIN. Alternatively, to generate the OR function, a logic 1 is placed on CLB input line FB and a complementary truth table is loaded into the F function generator. The constant logic 1 causes multiplexer C1 to generate an OR function of the complement of the output signal on CLB output line X and the carry-in signal on line CIN. The function of multiplexers C1–C4 and their interaction with the logic block are further discussed by New in U.S. Pat. No. 5,349,250 incorporated herein by reference.

Figure 5:
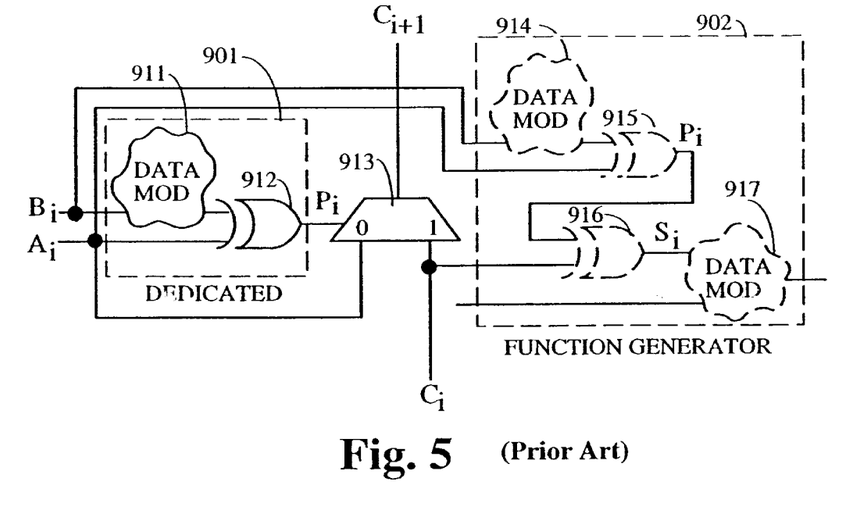
FIGS. 5 and 6 illustrate aspects of the CLBs described in U.S. Pat. No. 5,267,187 by inventors Hung-Cheng Hsieh et al., and U.S. Pat. No. 5,349,250 by inventor Bernard J. New.

Also known in the prior art from U.S. Pat. No. 5,267,187 by inventors Hung-Cheng Hsieh et al. entitled "LOGIC STRUCTURE AND CIRCUIT FOR FAST CARRY" are structures such as shown in FIG. 5. From two input signals $A_i$ and $B_i$, a function can be generated in function generator 902. This can include the sum function $S_i$ when function generator 902 is so configured. Dedicated hardware 901 included in the XC4000 products generates a propagate function $P_i$ for controlling carry multiplexer 913. The same input signal $A_i$ to function generator 902 also is an input signal to carry multiplexer 913.

Figure 6:
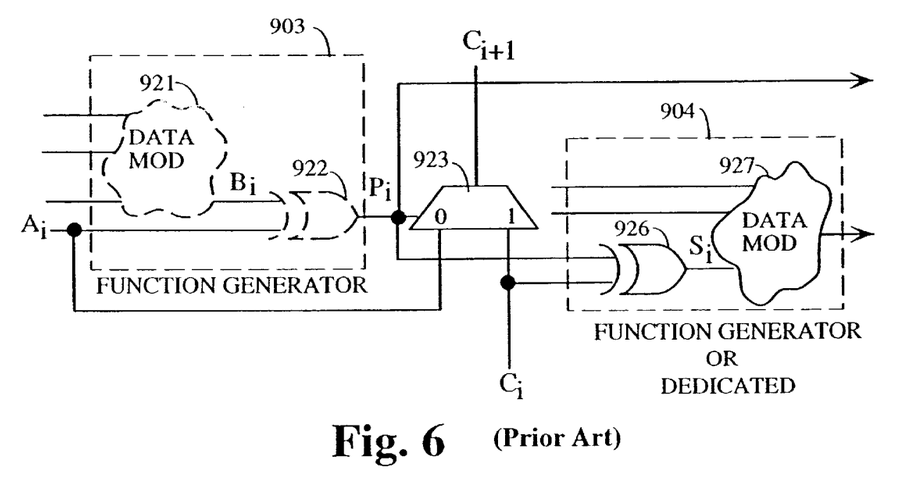

The structure of U.S. Pat. No. 5,349,250 is shown in FIG. 6. The input signal $A_i$ to function generator 903 is also an input to carry multiplexer 923. The sum $S_i$ is generated either in another function generator as was done in FIG. 5, or by a dedicated XOR gate 926.

Users of FPGAs frequently want to perform arithmetic functions including addition and multiplication. Addition (or subtraction) is easily performed in the architectures of either FIG. 5 or FIG. 6. When two numbers "a" and "b", each being multi-bit numbers, are to be added, bits of successively higher significance are applied to input terminals of successive function generators connected in the carry chain. For example if the bits $a_i$ and $b_i$ are applied to the structure of FIG. 5, then the next more significant bits $a_{i+1}$ and $b_{i+1}$ are applied to a structure (not shown) that is located directly above FIG. 5. Thus addition of two n-bit numbers can be performed in a structure using n copies of FIG. 5. For addition or subtraction, the structure of FIG. 6 also requires n copies to add two n-bit numbers.

However, the structures of FIGS. 5 and 6 are not efficient for multiplication. Multiplication is performed is follows. Table I shows a 4-bit unsigned multiplication example. Terms of the multiplication are shown at the left and an example multiplication is shown at the right. One can see that when the value of the b-bit is 1, the value of the full number "a" is shifted and added, whereas when the value of the b-bit is 0, the value of the number "a" is bypassed.

TABLE I

|   |   |   |   | a3 | a2 | a1 | a0 |   |   |   |   | 1 | 0 | 1 | 1 |
|---|---|---|---|---|---|---|---|---|---|---|---|---|---|---|---|
|   |   |   | × | b3 | b2 | b1 | b0 |   |   |   | × | 1 | 1 | 0 | 1 |
|   |   |   |   | a3b | a2b | a1b | a0b0 |   |   |   |   | 1 | 0 | 1 | 1 |
|   |   |   | 0 | 0 | 0 |   |   |   |   | 0 | 0 | 0 | 0 |   |   |
|   |   | a3b1 | a2b | a1b | a0b |   |   |   |   | 1 | 0 | 1 | 1 |   |   |
|   |   | 1 | 1 | 1 |   |   |   | + | 1 | 0 | 1 | 1 |   |   |   |
|   | a3b2 | a2b2 | a1b | a0b |   |   |   | 1 | 0 | 0 | 0 | 1 | 1 | 1 | 1 |
|   |   | 2 | 2 |   |   |   |   |   |   |   |   |   |   |   |   |
| + | a3b3 | a2b3 | a1b3 | a0b |   |   |   |   |   |   |   |   |   |   |   |
|   |   | 3 |   |   |   |   |   |   |   |   |   |   |   |   |   |
| r7 | r6 | r5 | r4 | r3 | r2 | r1 | r0 |   |   |   |   |   |   |   |   |

Figure 7:
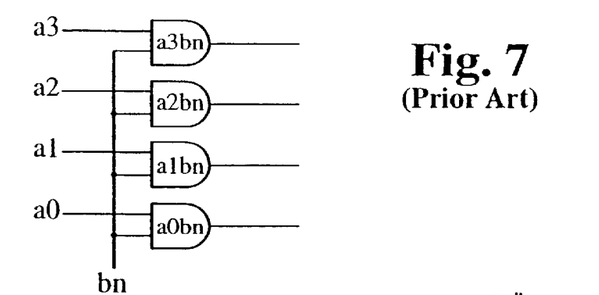
FIG. 7 shows a circuit for generating one row of a 4-bit multiplication.
Figure 8:
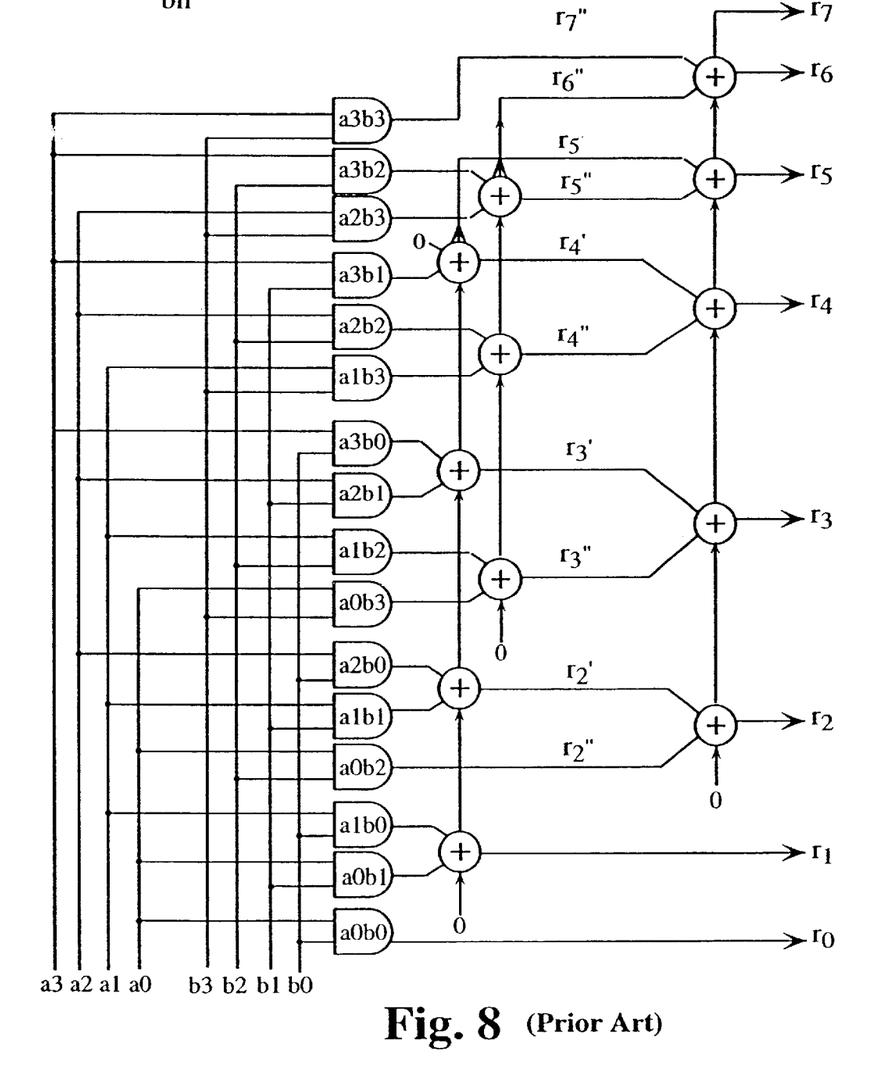
FIG. 8 shows a tree circuit for generating intermediate and final sums of two rows of a 4-bit multiplication.

One line in Table I can be produced by the circuit of FIG. 7. To produce the one line, the entire number "a" is ANDed with one bit bn of the number "b". To produce bits of the final result "r", all lines in the above table must be added. FIG. 8 shows a tree structure for adding the first two lines of TABLE I, adding the last two lines of TABLE I, and then adding the two sums. Intermediate results $r_0'$ through $r_5'$ are generated from adding the first two lines of the sum. Intermediate results $r_2''$ through $r_7''$ are generated from adding the last two lines of the sum. The right hand side of FIG. 8 shows the final addition being performed in the binary addition tree structure. (Some logic optimization has been performed whereby the sum of the most significant bits of the last two lines is folded in with the final addition.) A binary addition tree structure minimizes the delay between the time the input bits a0 through a3 and b0 through b3 are applied to the input terminals and the final result $r_0$ through $r_7$ appears at the output terminals. It is usually desirable to perform the operations of FIG. 8 with as little delay as possible. Four-bit numbers require two levels of addition. Eight-bit numbers require three levels. Thus a binary addition tree structure minimizes the number of levels and therefore minimizes delay.

Figure 9:
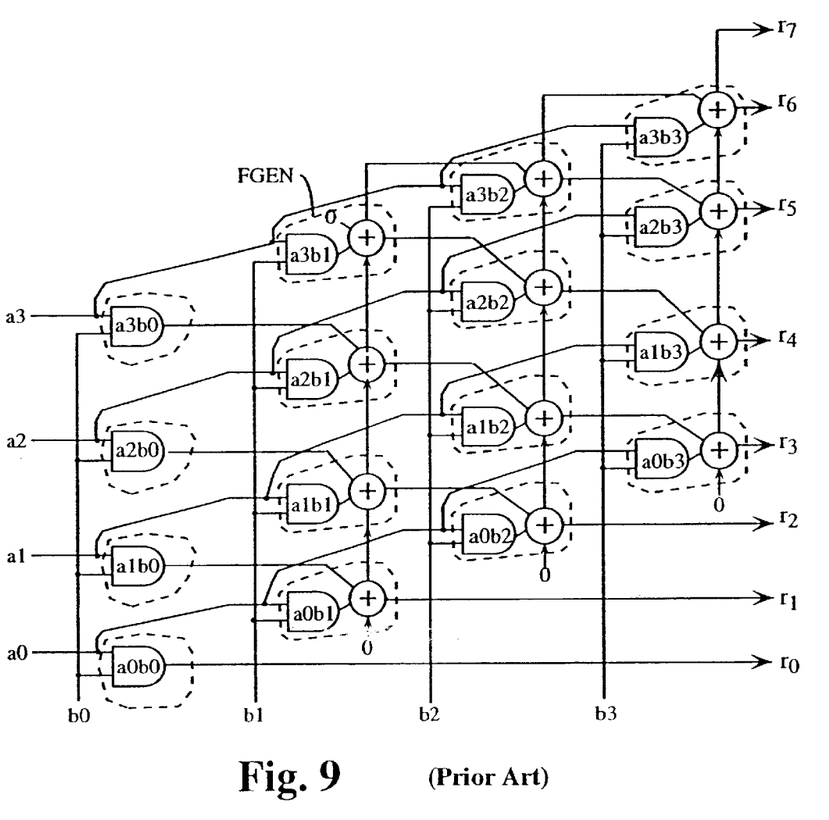
FIG. 9 shows a chain structure for combining intermediate sums to generate final results of a 4-bit multiplication and shows the grouping of elements into 16 units of FIG. 5 or 6.

However, it is also possible to perform multiplication using a chain addition structure for multiplication. FIG. 9 shows such a chain addition structure. The chain structure produces more delay than the tree structure but uses less area when implemented in four-input function generators because the chain structure can conveniently be divided into units having four inputs. For example, the structure labeled FGEN can be implemented in one function generator. In applications in which delay is not important but minimizing area is important, the chain structure may be chosen.

Figure 8A:
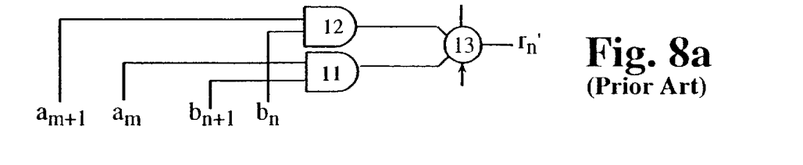
FIG. 8a shows a portion of FIG. 8 discussed in examples to follow.
Figure 10:
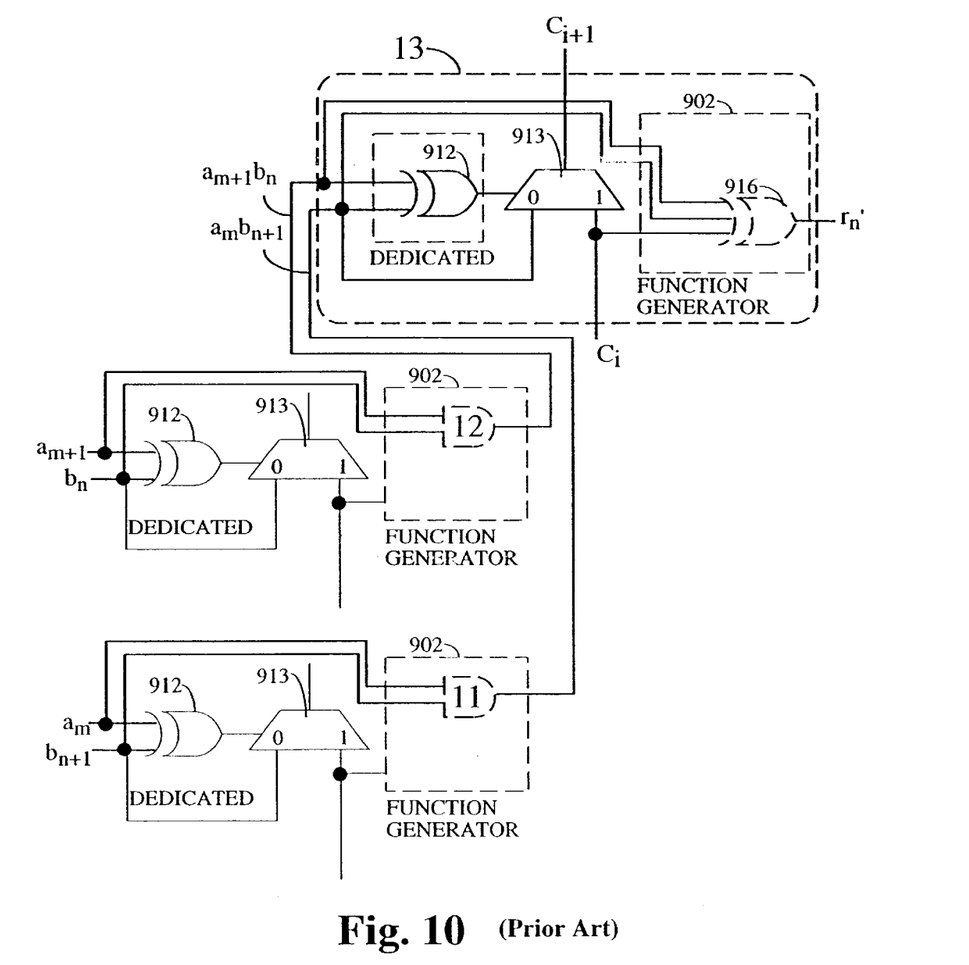
FIG. 10 shows the implementation of FIG. 8a in three of the units shown in FIG. 5.

FIG. 8a illustrates a portion of FIG. 8. The two AND gates 11 and 12 and carry chain adder 13 are shown in FIG. 8a in the same orientation as they are shown in FIG. 8. In order to perform the operation illustrated in FIG. 8a using the architecture of FIG. 5, three units of FIG. 5 are required. FIG. 10 shows this implementation. Two units are taken up simply implementing AND gates 11 and 12, and the third unit implements carry chain adder 13. Portions of the units not used are drawn with faint lines and portions used are drawn with heavy lines. Clearly, much of the available circuitry is not used; this architecture does not efficiently implement the multiplication operation.

Figure 11:
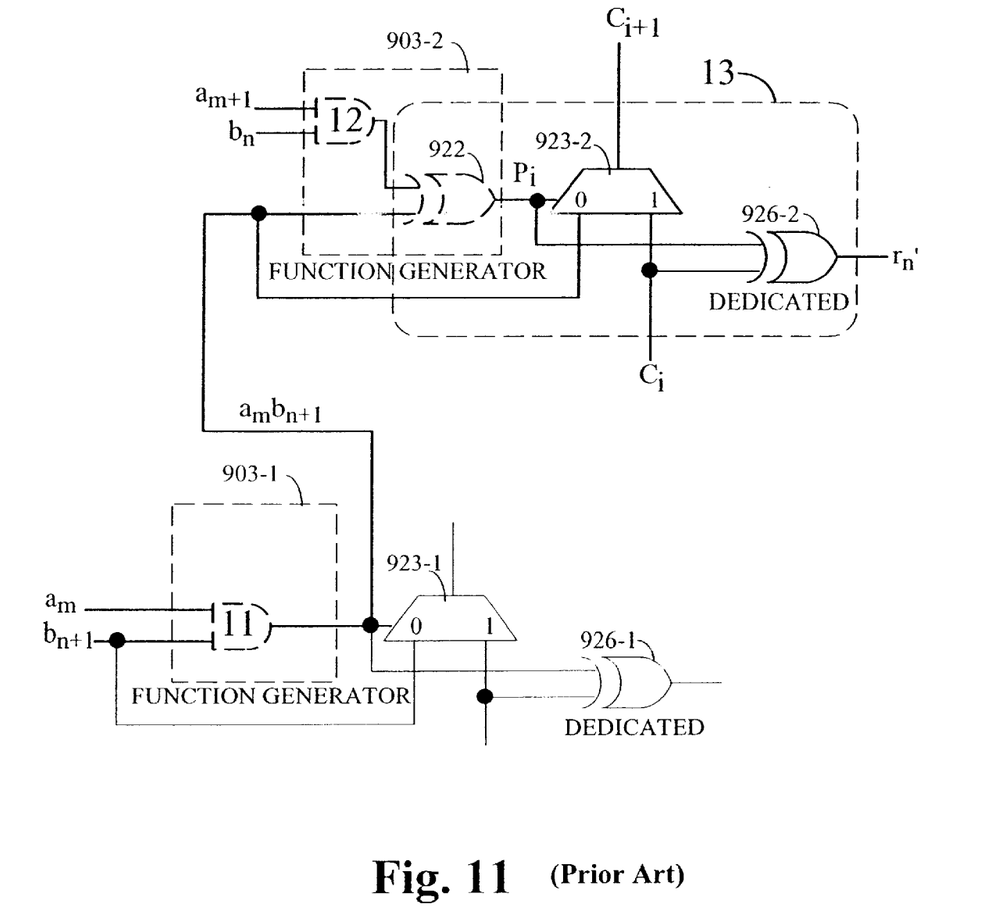
FIG. 11 shows the implementation of FIG. 8a in two of the units shown in FIG. 6.

In order to perform the same operation using the architecture of FIG. 6, two units of FIG. 6 are required, as shown in FIG. 11. AND gate 11 is formed in function generator 903-1 to combine two input signals $a_m$ and $b_{n+1}$. AND gate 12 is formed in function generator 903-2 to combine the other two input signals $a_{m+1}$ and $b_n$. Function generator 903-2 also forms part of the carry chain adder 13, generating propagate signal $P_i$ from the output of AND gate 12 and the output of AND gate 11, which is in function generator 903-1. Thus in the structure of FIG. 6, two such units are required to implement the logic shown in FIG. 8a. Thus the structure of FIG. 6 still wastes silicon area when performing multiplication.

Additionally, in the implementation shown in FIG. 11, the path through signal $a_m b_{n+1}$ has more delay than the path through signal $a_{m+1} b_n$, because there are two function generators on the $a_m b_{n+1}$ signal path. In a pipelined system (where both of these signals would have to be registered), AND gate 12 would have to be brought back out into a third function generator, and three units of FIG. 6 would be consumed.

When implementing multiplication in FPGAs, it is desirable to further reduce the silicon area required to implement such commonly used logic as well as to reduce delay in calculating the output signals.

OBJECTS OF THE INVENTION

A principal object of the present invention is to tailor the silicon area more closely to the desires of designers who will use the FPGA in which the invention is placed.

Another object is to minimize silicon area and thereby minimize cost by using portions of the CLB for more than one purpose.

Another object of the invention is to combine a flexible multi-purpose logic block with a small dedicated structure for generating AND and OR functions.

SUMMARY OF THE INVENTION

According to the invention, one of the carry chain input signals is derived from two of the function generator input signals. In a first embodiment, one carry chain input signal comes from a dedicated AND gate receiving two of the function generator input signals. For a multiplication operation using either a binary-addition-tree algorithm or a chain addition algorithm, the AND gate provides a low-cost low-latency multiplication feature. For a given number of bits to be multiplied, the structure including the AND gate requires fewer CLBs than the prior art structures, as well as less FPGA interconnect routing. Additionally, the structure offers low loading for all signals, thus high speed.

In a second embodiment, the AND gate and a four-input multiplexer are combined. The four-input multiplexer receives one input signal from the AND gate, one from one of the function generator input signals, one from a logic high source and one from a logic low source. This multiplexer facilitates the starting of a carry chain and the formation of wide AND gates and OR gates.

In one embodiment, the AND gate is provided at no cost in silicon area (with a possible small cost in metal routing) because AND gates exist as part of the decoding structure of the lookup table multiplexer, and the output signal from one of the AND gates is simply provided as input to both the carry chain multiplexer and the lookup table multiplexer.

An additional benefit of the invention is that wide AND, OR, NAND, and NOR functions can be generated using

DETAILED DESCRIPTION OF THE INVENTION

Figure 12:
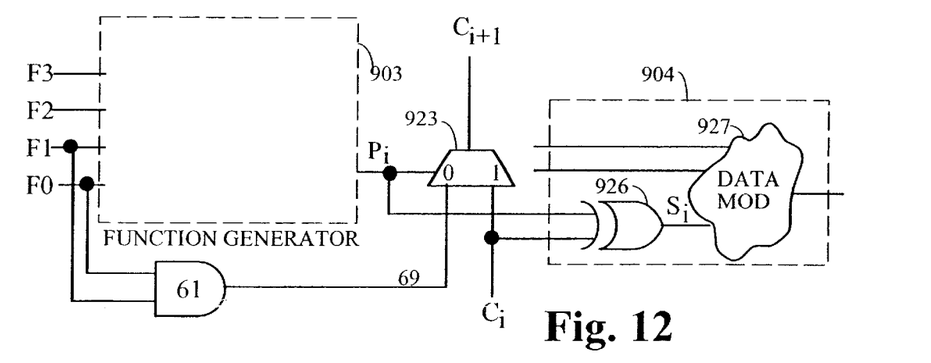
FIG. 12 illustrates a first embodiment of the invention using a dedicated AND gate.

In a first embodiment of the invention shown in FIG. 12, the second carry chain stage input signal is provided by an AND gate that takes its two input signals from two of the function generator input signals. In FIG. 12, as a novel feature of the present invention, AND gate 61 takes the AND function of two of the function generator input signals F0 and F1 and generates an input signal 69 to carry chain multiplexer 923. AND gate 61 facilitates the binary-addition-tree multiplication process discussed above in connection with FIG. 8) which utilizes multiple AND gates, more than can be configured in one function generator. The addition of dedicated AND gates such as AND gate 61 facilitates low latency multiplication and allows multiplication to be performed without additional function generators for supplying signals to a stage of the carry chain.

Figure 13:
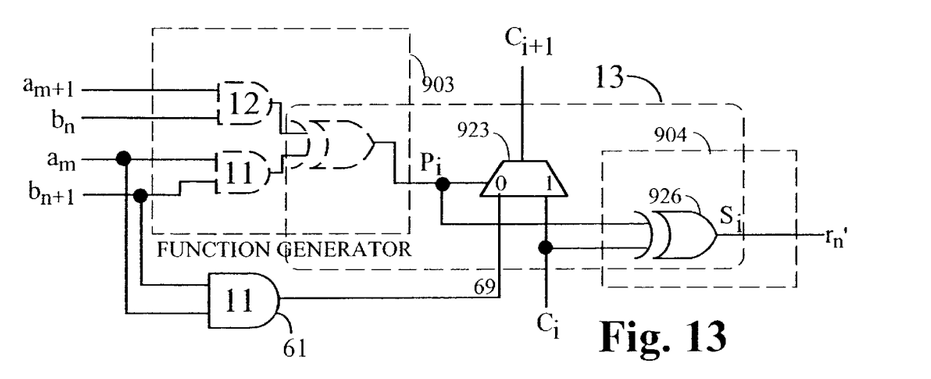
FIG. 13 shows the implementation of FIG. 8a in one of the units shown in FIG. 12.

FIG. 13 shows the structure of FIG. 12 configured to implement the logic of FIG. 8a. In FIG. 8a, the output of AND gate 11 is used in two ways inside adder 13: to provide input to the carry chain and to provide input to an XOR gate to generate the carry-propagate signal. As shown in FIG. 13, AND gate 11 is duplicated, appearing once in dedicated AND gate 61 and once as part of function generator 903. Since function generator 903 can generate any function of four input signals, the two AND gates 11 and 12 and the XOR gate for generating the carry propagate signal $P_i$ can all be implemented in function generator 903. Dedicated AND gate 61 can implement AND gate 11 and provide its output as an input to carry chain multiplexer 923. Thus a single unit of the structure of FIG. 12 can implement all the logic shown in FIG. 8a.

Figure 14:
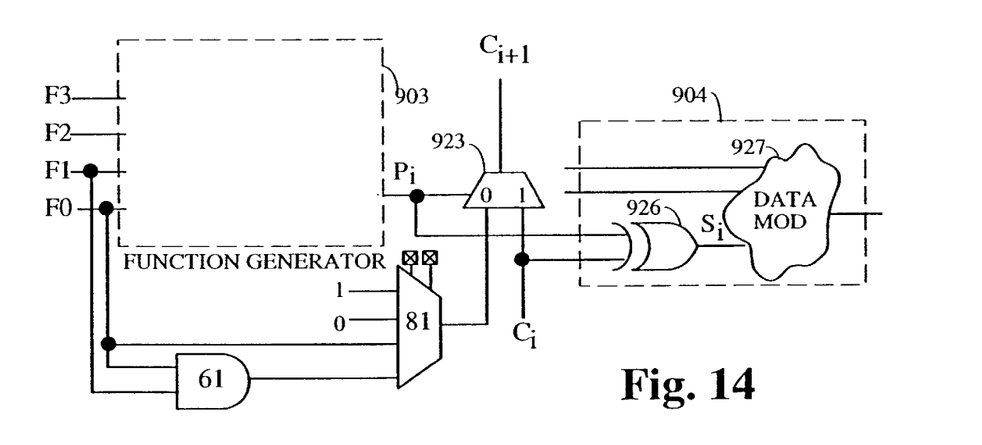
FIG. 14 illustrates a second embodiment of the invention combining the AND gate of FIG. 12 and a multiplexer.

In a second embodiment, shown in FIG. 14, a multiplexer for feeding the carry chain selects between four signals: one function generator input signal F0, constant high and low voltage signals, and the output of AND gate 61. The embodiment of FIG. 14 includes 4-input multiplexer 81, which provides one of these input signals to carry chain multiplexer 923. The logic ONE and logic ZERO inputs to carry chain input multiplexer 81 enable configuring the carry chain multiplexer 923 as either an AND gate or an OR gate for "ANDing" or "ORing" the outputs of the respective lookup table function generators as they propagate up the carry chain. (See discussion of FIG. 4.) Carry chain multiplexers 923 can be selectively configured by multiplexer 81 as AND or OR gates to facilitate certain arithmetic or comparison functions for the outputs of a plurality of function generators. Alternating AND and OR gates are commonly used to implement efficient carry chains. The AND gate also allows for specific arithmetic or comparison functions such as multi-bit comparisons.

FIG. 15

Figure 15:
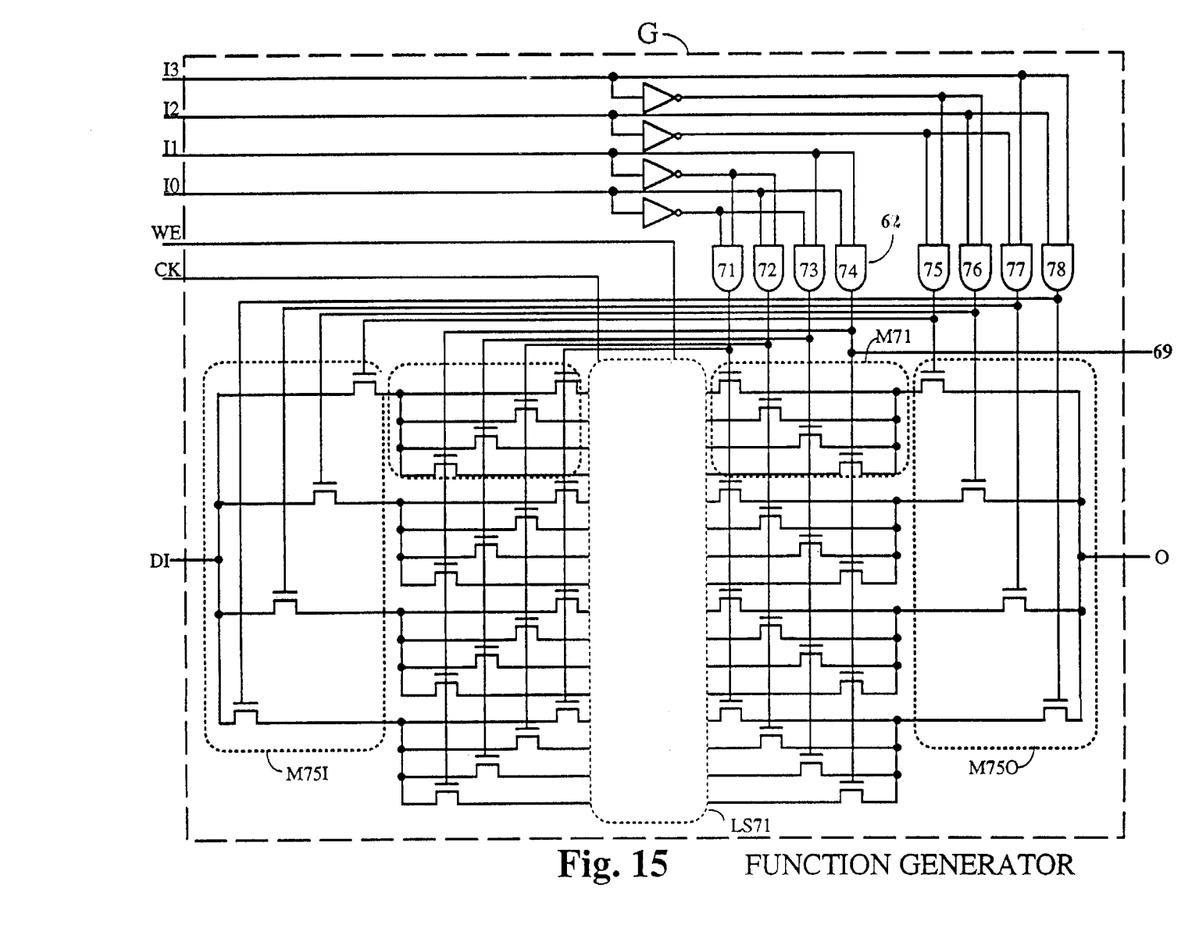
FIG. 15 illustrates an embodiment of function generator 903 of FIG. 14.

The AND gate 61 or 62 may be provided in ways other than the isolated AND gate illustrated in FIGS. 12, 14, and 15. As shown in FIG. 15, the lookup table function generator employs a plurality of AND gates 71 through 78 in an input signal decoder. In order to decode a 16 element LUT, four input signals are required. Doing the decoding in two stages strikes a good balance between speed and area. This involves decoding from 16 to 4 in four 4-to-1 multiplexers (e.g. M71 as controlled by AND gates 71 through 74) and then from 4 to 1 (e.g. in M75 as controlled by AND gates 75 through 78). To implement the 4 to 1 decoding, both the true and complement of two input signals need to be ANDed together. Since the AND function of AND gate 74 is already needed in the decoder it can be easily taken from this decoder, rather than being generated separately. All that is required is that an output of AND gate 74 be accessed and brought out of the LUT where it can be routed to the carry chain input multiplexer 923 of FIG. 12 or to multiplexer 81 of FIG. 14. This is shown in FIG. 15 by adding the label 62 to AND gate 74 and the label 69 to the output of AND gate 74 to show that these correspond to AND gate 62 and its output line 69 in FIG. 12. Thus, the LUT in a CLB may be configured to provide access to one or more AND gates thereof in lieu of a specially added AND gate, to achieve the inventive configuration disclosed herein. Other circuits illustrated in FIG. 15 are discussed by Bauer in related U.S. Pat. No. 5,899,413 incorporated herein by reference.

Figure 16:
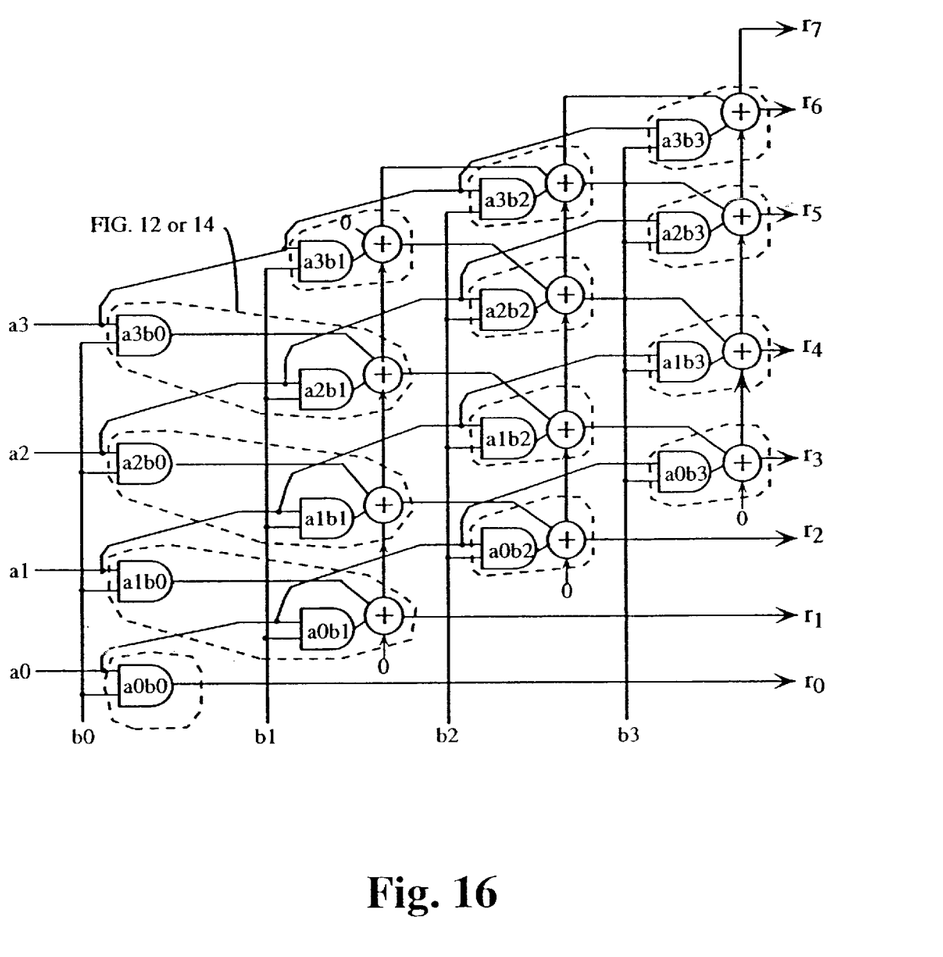
FIG. 16 shows the chain structure of FIG. 9 and shows the grouping of elements into 13 units of FIG. 12 or 14.

FIG. 16 differs from FIG. 9 by including dashed lines to indicate which logic is implemented in a structure having function units as shown in FIG. 12 or FIG. 14. The structure of the invention provides an advantage over the prior art because fewer than 16 units (in this case, 13 units) are required to implement the structure of FIG. 16.

Figure 17:
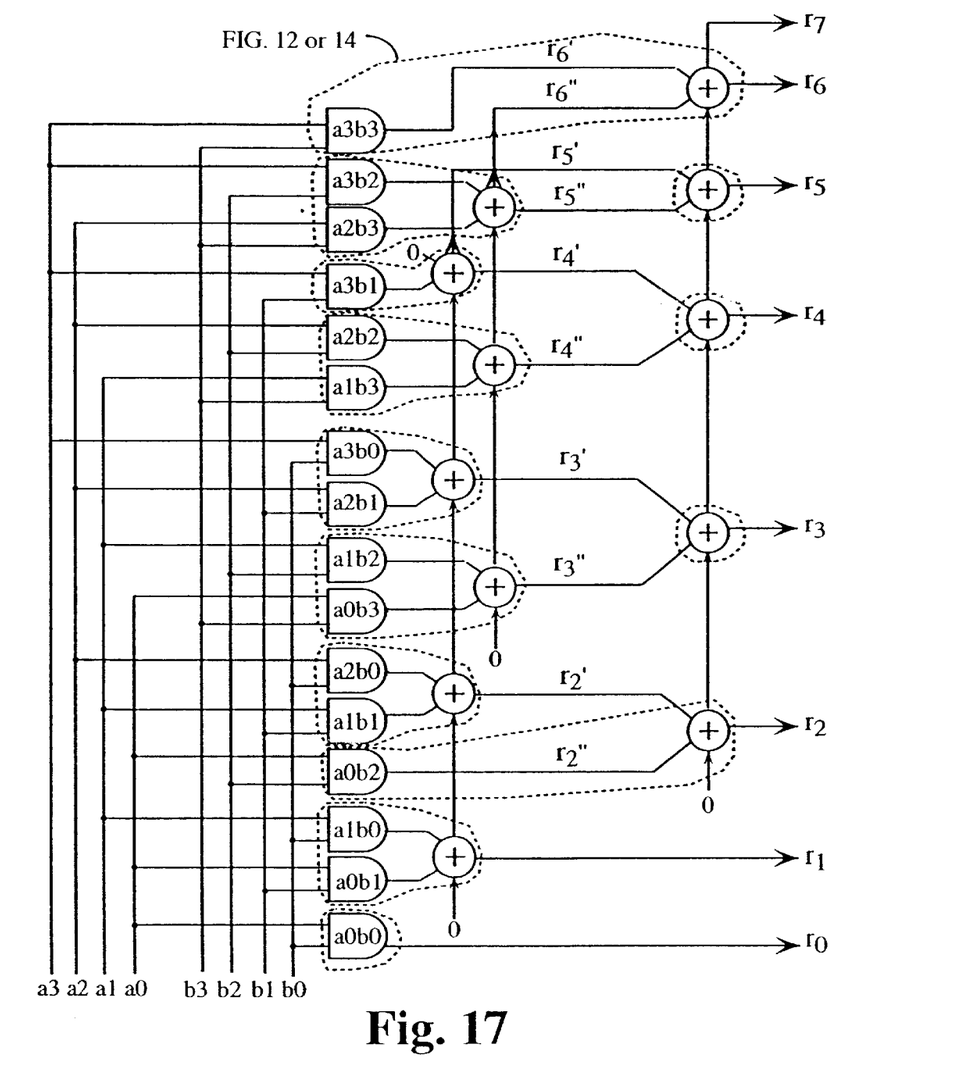
FIG. 17 shows the tree structure of FIG. 8 and shows the grouping of elements into 13 units of FIG. 12 or 14.

FIG. 17 includes dashed lines to indicate which logic of FIG. 8 can be implemented in a structure having units as shown in FIG. 12 or FIG. 14. In FIG. 17 only 13 units are required, whereas about 20–28 units would be required using the prior art structures of FIGS. 5 and 6.

Those having ordinary skill in the relevant art will, as a result of the disclosure made herein, now perceive various additions and/or modifications which may be made to the invention while achieving the objects thereof. For example, the second input to each carry chain multiplexer may be provided by wider multiplexers having other inputs including other gate devices to perform still other complex logic and arithmetic functions without requiring additional function generators. For another example, the input lines to AND gate 61 can be supplied as separate input lines from the interconnect structure rather than shared with function generator input lines F0 and F1. Accordingly, such additions and modifications are deemed to be within the scope of the invention which is to be limited only by the appended claims and their equivalents.

What is claimed is:

1. A field programmable gate array comprising:
   a plurality of configurable logic blocks (CLBs) each having a plurality of lookup table function generators, each such lookup table function generator having a plurality of N input lines for selecting one of $2^N$ memory cells; and
   a carry chain having a carry input and a carry output and a plurality of serially arrayed carry chain multiplexers, at least one respective such carry chain multiplexer being controlled by an output from a corresponding lookup table function generator, each such carry chain multiplexer having at least two inputs, one such input being provided by a previous carry chain multiplexer in said carry chain and the other such input being provided by an AND gate the inputs to which comprise a pair of input lines of said corresponding lookup table function generator.

2. A field programmable gate array comprising:
   a plurality of configurable logic blocks (CLBs) each having a plurality of lookup table function generators, each such lookup table function generator having N input lines for selecting one of $2^N$ memory cells; and
   a carry chain having a plurality of serially arrayed carry chain multiplexers, at least one of the plurality of carry chain multiplexers being associated with a corresponding carry chain input multiplexer having a first data input lead that is coupled to an output lead of a corresponding AND gate, said at least one of the plurality of carry chain multiplexers having at least two data input leads, one such data input lead being coupled to a previous carry chain multiplexer in said carry chain and the other such data input lead being coupled to an output lead of said corresponding carry chain input multiplexer, said at least one of the plurality of carry chain multiplexers being controlled by an output from a corresponding lookup table function generator, wherein said corresponding AND gate is a part of said corresponding lookup table function generator.

3. The field programmable gate array recited in claim 2, wherein a second data input lead of said corresponding carry chain input multiplexer is coupled to one of said lookup table function generator input lines.

4. The field programmable gate array recited in claim 2, wherein a constant logic ONE is present on a second data input lead of said corresponding carry chain input multiplexer.

5. The field programmable gate array recited in claim 2, wherein a constant logic ZERO is present on a second data input lead of said corresponding carry chain input multiplexer.

6. The field programmable gate array recited in claim 2, wherein a constant logic ONE is present on a second data input lead of said corresponding carry chain input multiplexer, and a constant logic ZERO is present on a third data input lead of said corresponding carry chain input multiplexer.

7. The field programmable gate array recited in claim 2, wherein said corresponding lookup table function generator comprises a lookup table, and said lookup table comprises said corresponding AND gate, and said corresponding AND gate is accessible from outside said lookup table.

8. The field programmable gate array recited in claim 2, wherein said corresponding lookup table function generator comprises a lookup table, said lookup table comprises a decoder, a multiplexer and said $2^N$ memory cells, said decoder generating output signals that control said multiplexer, wherein said corresponding AND gate is a part of said decoder.

9. The field programmable gate array recited in claim 8, wherein said corresponding AND gate supplies a multiplexer select input signal to a select input lead of said multiplexer, said multiplexer select input signal being one of said output signals generated by said decoder.

10. In a field programmable gate array (FPGA), a configurable logic block (CLB) receiving input signals and providing output signals, said CLB comprising:
    a two-input AND gate located within a lookup table, said lookup table located within a lookup table function generator, said AND gate receiving as input signals two of said CLB input signals and selectively providing one of said CLB output signals, said lookup table function generator outputting said one of said CLB output signals.

11. A circuit comprising:
    a carry chain comprising a multiplexer; and
    a function generator comprising a decoder, a multiplexer, and a plurality of memory cells, wherein the decoder generates decoder output signals that control the multiplexer of the function generator to select one of the plurality of memory cells, and wherein one of the decoder output signals is output from the function generator and is supplied to an input lead of the multiplexer of the carry chain.

12. The circuit of claim 11, wherein the decoder comprises a logic gate, and wherein the logic gate outputs said one of the decoder output signals.

13. The circuit of claim 11, wherein the multiplexer of the carry chain is a carry chain multiplexer.

14. The circuit of claim 11, wherein the multiplexer of the carry chain is a carry chain input multiplexer.

15. The circuit of claim 14, wherein the carry chain input multiplexer has a first data input lead that is coupled to receive a constant high voltage signal, the carry chain input multiplexer having a second data input lead that is coupled to receive a constant low voltage signal, the carry chain input multiplexer having a third data input lead that is coupled to receive said one of the decoder output signals.

16. The circuit of claim 11, wherein the circuit is a configurable logic block (CLB), and wherein the CLB is a part of programmable logic device.

* * * * *